United States Patent [19]

Parsons

[11] Patent Number: 4,864,219
[45] Date of Patent: Sep. 5, 1989

[54] METHOD AND APPARATUS FOR VERIFYING PROPER PLACEMENT OF INTEGRATED CIRCUITS ON CIRCUIT BOARDS

[75] Inventor: Philip B. Parsons, Andover, Mass.

[73] Assignee: GenRad, Inc., Concord, Mass.

[21] Appl. No.: 27,650

[22] Filed: Mar. 19, 1987

[51] Int. Cl.$^4$ .................. G01R 31/02; G01R 31/28
[52] U.S. Cl. ..................... 324/73 PC; 340/653; 371/22.6
[58] Field of Search ............ 324/73 PC, 73 R, 158 R; 340/653, 656; 371/15, 25

[56] References Cited

U.S. PATENT DOCUMENTS

| | | | |
|---|---|---|---|
| 3,891,279 | 6/1975 | Frait | 340/656 |
| 4,042,832 | 8/1977 | Cassarino, Jr. et al. | 340/653 |
| 4,245,331 | 1/1981 | Hamano et al. | 340/656 |
| 4,459,693 | 7/1984 | Prang | 371/20 |
| 4,631,724 | 12/1986 | Shimizu | 324/73 R |
| 4,727,317 | 2/1988 | Oliver | 324/158 R |
| 4,730,156 | 3/1988 | Matsuda | 324/158 R |

*Primary Examiner*—Ernest F. Karlsen
*Attorney, Agent, or Firm*—Nutter, McClennen & Fish

[57] ABSTRACT

In order to determine whether the proper type of integrated circuit is located in the proper position (16) and the proper orientation, a power source (18) applies a potential difference to circuit paths (26 and 28) that will properly power an integrated circuit (14) if it is of the proper type and in the proper orientation. Without attempting to place the integrated circuit (14) in a predetermined state, a test system (10) employs a milliammeter (32) first to measure the current driven by an output terminal (30) and then to measure the current that the output terminal (30) draws from a bias source (40). If a current level consistent with an active output terminal is measured in either step, a control circuit (38) concludes that the integrated circuit (14) is of the proper type and properly positioned. Otherwise, the control circuit (38) concludes that an integrated circuit is missing, of the wrong type, or improperly oriented. The test is thus performed with power applied to the integrated circuit so that the test can be based on reliable circuit parameters, but the damage that might otherwise result from a powered-up test is avoided because, since no time is expended in conditioning the integrated circuit to a predetermined state, the test can be made extremely short in duration.

14 Claims, 1 Drawing Sheet

METHOD AND APPARATUS FOR VERIFYING PROPER PLACEMENT OF INTEGRATED CIRCUITS ON CIRCUIT BOARDS

BACKGROUND OF THE INVENTION

The present invention is directed to testing of circuit boards. In particular, it is directed to verifying that individual integrated circuits are in their proper locations on the circuit board and are oriented properly.

Circuit-board manufacturers typically test their boards at a variety of levels. In-circuit tests determine whether individual integrated circuit function properly on the board. Functional tests determine whether the integrated circuits work together to perform the circuit board's intended function. Simpler tests usually precede in-circuit and functional testing. Continuity tests, for instance, verify that electrical continuity exists between points that are intended to be connected, and shorts tests insure that there are no short circuits between nodes that should be isolated.

In addition to these tests, it is also desirable to perform tests to determine whether integrated circuits of the proper types are properly positioned and oriented on the circuit board. Initial detection of a missing or misoriented integrated circuit or an integrated circuit of the wrong type eliminates significant diagnostic effort at a later stage in the testing process. However, many methods for making the necessary determinations automatically have proved unsatisfactory.

The method that is conceptually the most straightforward is to include in the in-circuit test of the integrated circuit an initial diagnostic sequence of stimuli and measurements that would make an initial determination of proper integrated-circuit placement and thus eliminate further testing if the integrated circuit is determined to be missing or in an improper orientation. In the past, this approach has proved disadvantageous because a symptom of improper orientation is often that the integrated circuit burns or even explodes soon after power is applied to it.

Many manufacturers have therefore turned instead to power-off tests, in which the tester measures passive impedances between terminals of the integrated circuit without applying power to it. However, integrated-circuit manufacturers do not ordinarily include such impedances in their specifications, and such impedances can vary greatly between integrated circuits of the same type supplied by different sources. As a result, such tests tend to be unreliable, so they are often omitted or ignored in practice.

It is accordingly an object of the present invention to test for proper type, location, and orientation in such a manner as to provide reliable results without subjecting the circuit elements to a significant risk of damage. Another object is to test circuit boards in an improved manner.

SUMMARY OF THE INVENTION

The foregoing and related objects are achieved in a method and apparatus for testing the circuit board with power applied but for doing so in such a manner that the duration of power application can be kept too short to cause damage to a misoriented integrated circuit. This is achieved by simply determining whether an integrated-circuit terminal that should be performing as an output terminal actually does so. This determination is made without regard to logic level; i.e., if the terminal is not found to be drawing enough current, it is tested to see whether it is driving enough. In this way, no time is expended in driving integrated-circuit input terminals to bring the integrated circuit to a predetermined state, so the duration of power application is very low, and no additional power is consumed in driving integrated-circuit input terminals. The application of power therefore does not ordinarily cause damage to incorrectly oriented integrated circuits. Furthermore, since the test is based on predictable, power-on circuit parameters, it is more reliable than power-off tests are.

BRIEF DESCRIPTION OF THE DRAWINGS

These and further features and advantages of the present invention are described below in connection with the accompanying drawings, in which.

DETAILED DESCRIPTION OF THE PREFERRED EMBODIMENTS

Figure 1:
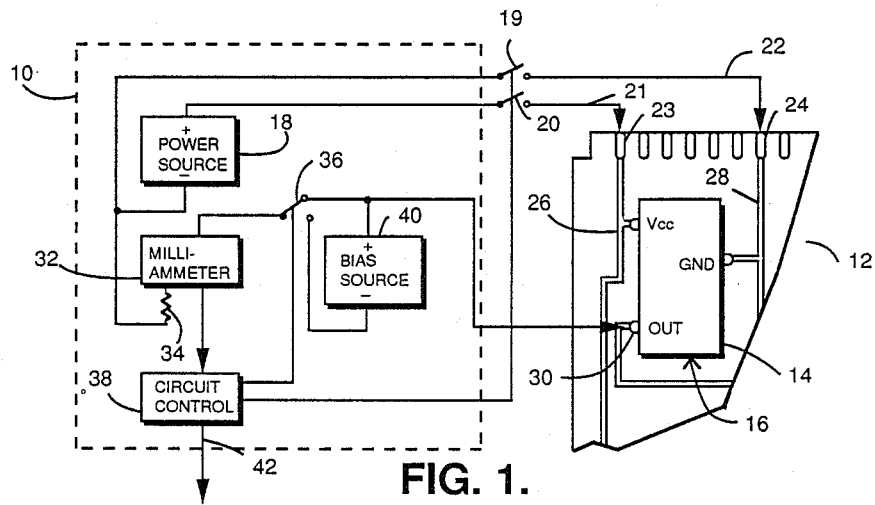
FIG. 1 is a block diagram depicting a version of the present invention implemented in analog test equipment.

FIG. 1 depicts an analog test system 10 for determining whether a circuit board 12 includes a circuit module, typically a single integrated circuit 14 in a predetermined location 16 on the board 12. The system 10 is shown in a highly simplified manner; many connections shown as permanent are actually made through multiplexer connections provided in an existing circuit tester.

The test that it performs is a simple screening process. It senses a circuit-board node that the integrated-circuit output terminal in question should be driving, and it determines whether more than a predetermined minimum current is being drawn or driven. If the current is not greater than the minimum, then no integrated-circuit output terminal is connected to that node, so it can be concluded that the integrated circuit in question is missing, misoriented, or of the wrong type. While some integrated circuits of the wrong type can escape detection by this method, this method will catch most of them, and it will reject no correctly positioned and oriented integrated circuit of the proper type.

The test system 10 includes a power source 18 whose terminals are connected through switches 19 and 20 to probes 21 and 22, which contact the circuit board's $V_{cc}$ and ground terminals 23 and 24. Terminals 23 and 24 provide electrical communication to paths 26 and 28, respectively, which conduct power to the various integrated circuits on the board 12. If integrated circuit 14 is of the proper type and is located in position 16 in the proper orientation, probes 21 and 22 in the positions indicated will apply power properly to it, and a terminal 30 of integrated circuit 14 will act as an output terminal; i.e., given a low enough load impedance, it will draw or drive more than a predetermined minimum current. The tester 10 operates to determine whether terminal 30 is in fact operating as an output terminal. If it is not, integrated circuit 14 is either missing, of the wrong type, or misoriented.

To determine whether terminal 30 acts as an output terminal, a milliammeter 32 is connected through a current-limiting resistor 34 to the ground terminal 24 and through a switch 36 to output terminal 30. A control circuit 38 initially operates switch 36 to the position shown in FIG. 1. With switch 36 in this position, the positive side of a bias source 40 is connected to the output terminal 30, but the negative side is left "floating." With switch 36 in this state, therefore, the bias source 40 does not affect circuit operation, and milliammeter 32 operates to measure the current that flows between the output terminal 30 and ground. The milliammeter 32 sends signals representing this measurement to control circuit 38. If this current is within proper limits, typically between 10 and 150 milliamperes for TTL circuitry, the control circuit 38 concludes that terminal 30 is operating properly as an output terminal in its high logic state. It therefore sends an indication over line 42 to further circuitry or an indicator, not shown, to indicate that it has not detected an improperly positioned or oriented integrated circuit or an integrated circuit of the wrong type, and the test is complete.

If the milliammeter 32 detects a current less than 10 milliamperes, on the other hand, terminal 30 is not operating as an output terminal in the high logic state, but it may still be operating as an output terminal in the low logic state. To determine whether this is so, the control circuit 38 operates the switch 36 to the position opposite that shown in FIG. 1, thereby placing the bias source 40 in series with the milliammeter 32. The milliammeter 32 therefore measures the current that the output terminal 30 draws from the bias source 40. If this current is within a prescribed range, typically (but not necessarily) the same 10-to-150-milliampere range mentioned above, then terminal 30 is operating properly as an output terminal in a low logic state, and control circuit 38 provides the signal on line 42 to indicate that it has found no defect. On the other hand, if the current is less than the 10-milliampere lower limit, the signal on line 42 indicates that an integrated circuit of the proper type and orientation is not present in position 16, and the control circuit 38 opens switches 19 and 20 to interrupt the power applied to the circuit board 12.

If the milliammeter 32 measures a current that is greater than the predetermined maximum in either position of switch 36, the control circuit 38 concludes that the integrated circuit 14 is reversed. An excessive output current typically results from an integrated circuit that, like the integrated circuit of FIG. 1, has power terminals that are symmetrically arranged. If such an integrated circuit is inserted backwards into the circuit board, the power is still applied to the proper terminals, but it is applied in the reverse direction. For TTL circuitry, a result of such a reversed power application is that the output terminal draws or drives more than the nominal output-terminal current. Accordingly, if the milliammeter 32 measures current greater than the predetermined maximum, the control circuit 38 opens switches 19 and 20 to interrupt the application of power, and it sends a signal on line 42 that indicates specifically that the integrated circuit is not in its proper orientation.

The version of the invention described in connection with FIG. 1 is referred to as an analog version, since it typically is performed by a circuit tester that has capabilities for making analog measurements. Analog testers are distinguished by their ability to make measurements and thus arrive at a voltage, current, impedance, or other value. A digital tester, on the other hand, merely indicates whether the quantity sensed is above or below a predetermined threshold or is inside or outside a predetermined range. Automatic test equipment, of course, comes with a wide variety of capabilities, but analog testers usually have the ability to supply or sense only a relatively small number of different analog signals simultaneously, and they consequently drive or sense only a small number of nodes simultaneously in most cases. In contrast, digital testers usually can supply or sense relatively large numbers of independent digital signals simultaneously, and they are often called on to drive and sense large numbers of nodes simultaneously.

Figure 2:
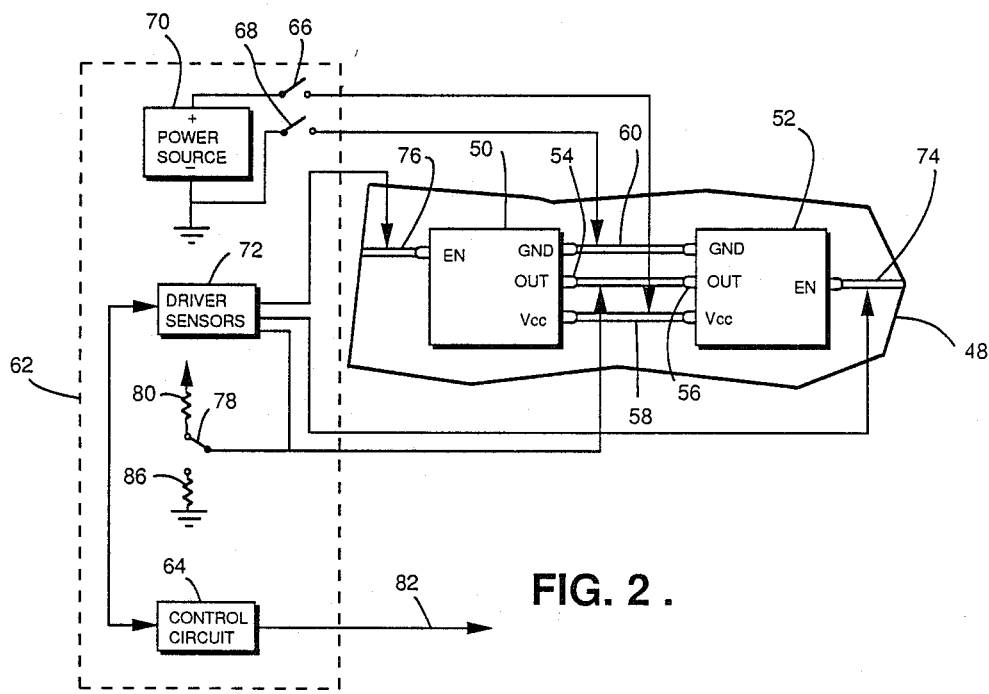
FIG. 2 is a block diagram depicting a version of the present invention implemented in digital test equipment.

With this distinction in mind, we turn to the embodiment of FIG. 2, which typically is performed by a digital tester or by those parts of a hybrid tester that perform digital functions. In FIG. 2, a circuit board 48 has two integrated circuits 50 and 52 mounted on it. These integrated circuits 50 and 52 have output terminals 54 and 56, respectively. When these integrated circuits are in their proper positions, terminals 54 and 56 are on the same electrical node. A common output node is typical of bus-oriented circuitry, and such circuitry can present a problem to a straightforward application of the method described in FIG. 1. Specifically, such integrated circuits with common output nodes also typically have common power nodes, which are indicated by reference numerals 58 and 60 in FIG. 2. Thus, when power is applied to the integrated circuit in question, it is also applied to an integrated circuit that ordinarily drives the common output node. So the test described in connection with FIG. 1 cannot determine whether the node is being driven by integrated circuit 50, integrated circuit 52, or both.

In accordance with the method of FIG. 2, however, the test system 62 of FIG. 2 not only applies power to the integrated circuits but also disables integrated circuit 52 so that its output terminal 56 does not affect the output of terminal 54 of integrated circuit 50. It ordinarily is possible to disable an output terminal such as output terminal 56 because, if more than one output terminal is on the same node, those terminals are "tri-statable"; i.e., they can be placed not only in high and low driving states but also, by controlling an enable terminal, in a high-impedance state.

The test system 62 includes a control circuit 64 that operates switches 66 and 68 to connect the terminals of a power source 70 to the $V_{cc}$ and ground nodes 58 and 60, thereby applying power not only to the integrated circuit 50 under test but also to the adjacent integrated circuit 52. Test system 62 typically is of the digital type, which includes a plurality of driver-sensors 72. The driver-sensors are operable by the control circuit 64 to drive a node to one or the other of the two predetermined logic levels or to determine whether a node is in one or the other of the two predetermined logic-level ranges.

In order to determine whether an integrated circuit of the proper type is in the position occupied in FIG. 2 by integrated circuit 50, the control circuit 64 operates two of the driver-sensors of driver-sensor unit 72. One driver-sensor drives the enable terminal 74 of integrated circuit 52 high, thereby disabling output terminal 56 of that integrated circuit. The other drives enable terminal 76 of integrated circuit 50 low, thereby enabling its output terminal 54. At the same time, the control circuit 64 operates a switch 78 to connect output terminal 54 through an impedance 80 to a positive voltage source. One of the sensors of driver-sensor unit 72 senses the signal at output terminal 54. If that output terminal is driving its output node low, then it must draw current through impedance 80 to achieve the low logic level. A sensor in the driver-sensor unit 72 determines whether the output voltage of terminal 54 is below the upper threshold of the lower logic level. If it is, the control circuit 64 concludes that integrated circuit 50 is of the proper type and is in the proper location and orientation. It accordingly sends a signal indicative of this conclusion on line 82 to an appropriate indicating device (not shown), and the test is complete.

On the other hand, if output terminal 54 is not driving its node to a low level, the voltage of that node is pulled to the level of the positive source, so the sensor in driver-sensor unit 72 does not sense a voltage below the upper threshold of the lower logic range, and control circuit 64 proceeds to the next step of the test. It operates switch 78 to the position opposite that shown in FIG. 2 so that output terminal 54 is now connected through impedance 86 to ground. If output terminal 54 is not driving its output node high, then the voltage of the output node will be pulled to ground by that connection, and the sensor in driver-sensor unit 72 indicates this fact to control circuit 64. Control circuit 64 accordingly concludes that integrated circuit 50 is of the wrong type, is misoriented, or is missing, so it opens switches 66 and 68 to remove power from the integrated circuit, and it places a signal on line 82 that represents its conclusion. If output terminal 54 is driving its output node high, on the other hand, it drives enough current through impedance 86 to raise the voltage of that node above the lower threshold of the upper logic level, and the sensor indicates this fact to control circuit 64. Control circuit 64 accordingly concludes that integrated circuit 50 is an integrated circuit of the proper type in the proper location and orientation. It therefore places on line 82 a signal that indicates this fact.

If a low logic level is not sensed with switch 78 in the illustrated position and a high logic level is not sensed in the other position, one might then conclude that integrated circuit 50 is not of the proper type or is missing or in the wrong orientation. I have found, however, that such a sequence can result even when an integrated circuit of the proper type is in the proper location and orientation. The reason for this is that changes in the state of switch 78 can cause signals to be applied to input terminals, not shown, on integrated circuit 50 that cause its output terminal 54 to change states between test steps. Thus, although terminal 54 would be driving its output node, it may be driving it high during the first step of the test and low during the second step of the test, so control circuit 64 would not have concluded during either step that integrated circuit 50 was of the proper type and properly positioned and oriented.

To deal with this possibility, switch 78 is returned to the illustrated position, and a third step identical to the first step is performed. I have found that, if an output terminal changes state in tests of this nature, it ordinarily is susceptible to change in only one direction, so the third step will detect an active output terminal if the first two steps have not.

In short, if node 54 is detected to be a driving node in any of the three steps, control circuit 64 immediately sends an indication on line 82 that the location in question contains the proper type of integrated circuit in the proper orientation, and it opens switches 66 and 68 to terminate the test. If terminal 54 has not been identified as a driver terminal in any of the three steps, then control circuit 64 opens switches 66 and 68 to remove power and thus avoid damage to an improperly oriented integrated circuit, and it sends a signal on line 82 to indicate that there is an anomaly in the location under inspection.

With the exception of the application of power and disabling signals, these three steps are the only steps that the test requires; in almost all cases, there is no need to drive the input terminals of the integrated circuits with a sequence of input signals in order to put the integrated circuit into the proper state. Thus, power can be applied to the integrated circuits for only a very brief period, a period so brief that no integrated circuit is damaged even if it is improperly oriented when the power is applied. (In a very small number of instances, it takes more than simply a single level signal on an enable terminal to disable the circuits that are not under test. In such instances, a short sequence of vectors must be applied. Even in such instances, though, the period of power application can be much shorter than that for conventional tests.)

The test described in connection with FIG. 2 provides advantages over the test described in connection with FIG. 1 because it can disable other integrated circuits that would otherwise drive the node under inspection. On the other hand, the test described in connection with FIG. 2 is not as effective for non-bus devices with symmetrical power terminals. When such devices are reversed, the output terminal can still drive its output node, and the test described in connection with FIG. 2 would conclude as a result that the integrated circuit is in the proper orientation. In contrast, the test described in connection with FIG. 1 not only determines whether the terminal in question is driving but also measures that current, and if the current exceeds the proper range, the test system of FIG. 1 concludes that a symmetrical integrated circuit is reversed. Accordingly, while the present invention can be employed by using only the test described in connection with FIG. 1 or only the test described in connection with FIG. 2, the most comprehensive application of the present invention is to apply both tests in sequence.

The two types described in connection with FIGS. 1 and 2 have been segregated in the foregoing description because the organization of many existing automatic circuit testers is such that digital test circuitry and analog test circuitry operate separately, and the first test requires the capabilities of the analog circuitry depicted in FIG. 1, while the second test is most conveniently performed by digital circuitry such as that shown in FIG. 2. However, there is no reason in principle why the two types of tests could not be combined; the other integrated circuits could be disabled while the milliammeter measurements described in connection with FIG. 1 are made. Moreover, an analog test system such as that illustrated in FIG. 1 could in principle be employed to carry out the test of FIG. 1; a positive source could be connected to the enabling terminals of the various other integrated circuits to disable them from driving the node of interest. The only reason why an analog system ordinarily would not be used is that the positive sources in an analog system tend to be low in number as well as low in impedance; it often is not possible to drive as many enable terminals as is necessary at as low a current level as is preferable to keep the risk of damage low. Nonetheless, the basic methods described here are not restricted to particular types of tests, so they can be practiced with many kinds of equipment.

Moreover, this test can be expanded to increase its accuracy and to provide rudimentary in-circuit testing. The two examples described so far tested for only a single output terminal for each integrated circuit; if the one output terminal is found in the right place, the integrated circuit passes the test. Of course, certain integrated circuits of the wrong type may have the same power-terminal locations as the correct integrated circuit does and have an output terminal at the location sensed in the test. Such incorrect integrated circuits would not be detected.

To increase the likelihood of detection, the test can be expanded to test for more than one of the output terminals of the correct type of integrated circuit. The integrated circuit of an incorrect type would then have to have output terminals at all of the sensed locations in order to escape detection. By increasing the number of output terminals tested, a rudimentary in-circuit test can also be performed; one can test to determine whether all of the output terminals that the integrated circuit should have are actually performing as output terminals. If they are not, the integrated circuit is defective.

It is thus apparent that the teachings of the present invention can be practiced in a wide variety of embodiments and represent a significant advance in the art.

I claim:

1. A method for testing a circuit board to determine if it is correctly assembled, the method comprising the steps of:
   A. applying an operating potential difference to the circuit board at power-terminal locations, so that a selected circuit module on the circuit board will be powered if the circuit module is of a predetermined proper type and in a predetermined proper position with a predetermined proper orientation;
   B. sensing an amount of current, the amount of current being one of the current drawn by the output terminal and the current driven by the output terminal, in response to the application of the operating potential and if the current sensed is not within a prescribed range, sensing an amount of current, the amount of current being the other one of the current drawn by the output terminal and the current driven by the output terminal, in response to the application of the operating potential; and
   C. producing an indication that the circuit board does not contain an operative digital circuit module of the proper type in the proper position and orientation, if the amount of current sensed is not within a range defined by a predetermined maximum and minimum output-terminal operating current for the selected circuit module.

2. A method as defined in claim 1 wherein:
   A. the sensing step comprises determining whether the magnitude of current driven or drawn at the board output-terminal location is greater than a predetermined minimum driving or drawing magnitude, respectively; and
   B. the indicating step comprises indicating that the board does not contain a digital circuit module of the predetermined proper type in the predetermined proper position and orientation if it is determined in the sensing step that the magnitude of current driven or drawn at the board output-terminal location is not greater than the respective predetermined minimum driving or drawing magnitude.

3. A method as defined in claim 2 wherein:
   A. the sensing step comprises determining whether the magnitude of current drawn or driven at the board output-terminal location is greater than the respective predetermined minimum drawing or driving magnitude and less than a predetermined maximum drawing or driving magnitude, respectively; and
   B. the indicating step comprises indicating that the board does not contain a digital circuit module of the predetermined proper type in the predetermined proper position and orientation if it is determined in the sensing step that the magnitude of current drawn or driven at the board output-terminal location is not greater than the respective predetermined minimum drawing or driving magnitude and less than the predetermined maximum drawing or driving magnitude.

4. A method as defined in claim 3 wherein the indicating step comprises indicating that the circuit module is in a reversed orientation if the power-application terminals of the circuit of the proper type are symmetrically disposed and it is determined in the sensing step that the magnitude of current drawn or driven at the board output-terminal location is not less than the respective predetermined maximum driving or drawing magnitude.

5. A method as defined in claim 1 further including, before the sensing step, the step of disabling any output port on the board that will be in electrical communication with the output terminal of a given circuit module of the proper type if the given circuit module is in the predetermined proper position and orientation.

6. An apparatus for testing a circuit board to determine if it is correctly assembled, the apparatus comprising:
   A. a power source for applying an operating potential difference to the circuit board at power-terminal locations, so that a circuit module on the circuit board will be powered if the circuit module is of a predetermined proper type and in a predetermined proper position with a predetermined proper orientation;
   B. sensing means including means for determining the amount of current driven at an output terminal location of the circuit module and the amount of current drawn at the output terminal, for sensing the amount of current that the output terminal is driving or drawing in response to the application of the operating potential; and
   C. indicating means, responsive to the sensing means, for producing an indication that the circuit board does not contain an operative digital circuit module of the proper type in the proper position and orientation, if the amount of current sensed is not within a range defined by a predetermined maximum and minimum output-terminal operating current for the selected circuit module.

7. An apparatus as defined in claim 6 wherein:
   A. the sensing means comprises means for determining whether the magnitude of current driven or drawn at the board output-terminal location is greater than a predetermined minimum driving or drawing magnitude, respectively; and
   B. the indicating means produces an indication that the board does not contain a digital circuit module of the predetermined proper type in the predetermined proper position and orientation if the sensing means determines that the magnitude of current driven or drawn at the board output-terminal location is not greater than the respective predetermined minimum driving or drawing magnitude.

8. An apparatus as defined in claim 7 wherein:
A. the sensing means comprises means for determining whether the magnitude of current drawn or driven at the board output-terminal location is greater than the respective predetermined minimum magnitude and less than a predetermined maximum drawing or driving magnitude, respectively; and
B. the indicating means produces an indication that the board does not contain a digital circuit module of the predetermined proper type in the predetermined proper position and orientation if the sensing means determines that the magnitude of current drawn or driven at the board output-terminal location is not greater than the respective predetermined minimum drawing or driving magnitude and less than the respective predetermined maximum drawing or driving magnitude.

9. An apparatus as defined in claim 8 wherein the indicating means produces an indication that the circuit module is in a reversed orientation if the power-application terminals of the circuit of the proper type are symmetrically disposed and the sensing means determines that the magnitude of current drawn or driven at the board output-terminal location is not less than the respective predetermined maximum magnitude.

10. An apparatus as defined in claim 6 further including means for disabling, before the sensing means senses the board output-terminal location, any output port on the board that will be in electrical communication with the output terminal of a given circuit module of the proper type if the given circuit module is in the predetermined proper position and orientation.

11. A method as defined in claim 1 wherein:
A. the sensing step comprises the steps of, in order,
  (i) determining for a first time if the magnitude of current drawn or driven at the board output-terminal location is below an upper threshold logic-low level;
  (ii) determining if the magnitude of current drawn or driven at the board output-terminal location is above a lower threshold logic-high level; and
  (iii) determining for a second time if the magnitude of current drawn or driven at the board output-terminal location is below an upper threshold logic-low level; and
B. the indicating step comprises indicating that the board does not contain a digital circuit module of the proper type in the predetermined position and orientation if it was determined in the sensing step (i) that the current drawn or driven was not below the predetermined upper threshold, and that in step (ii) the current driven was not above the predetermined lower threshold, and that in step (iii) for the second time, the current drawn or driven was not below the upper threshold.

12. An apparatus as defined in claim 6 wherein:
A. the sensing means comprises:
  (i) first means for determining if the magnitude of current drawn or driven at the board output-terminal location is below an upper threshold logic-low level;
  (ii) second means for determining if the magnitude of current drawn or driven at the board output-terminal location is above a lower threshold logic-high level; and
  (iii) third means for determining, after the operation of said second means, if the magnitude of current drawn or driven at the board output-terminal location is below an upper threshold logic-low level; and
B. the indicating means comprises means for indicating that the board does not contain a digital circuit module of the proper type in the predetermined position and orientation if it was determined by said first means that the current drawn or driven was not below the predetermined upper threshold, and by said second means that the current driven was not above the predetermined lower threshold, and by said third means that the current drawn or driven was not below the upper threshold.

13. A method as defined in claim 1 wherein:
A. the sensing step comprises the steps of, in order,
  (i) determining for a first time if the magnitude of current drawn or driven at the board output-terminal location is sufficient to establish a predetermined logic level;
  (ii) determining if the magnitude of current drawn or driven at the board output-terminal location is sufficient to establish a logic level which is the complement of the predetermined logic level; and
  (iii) determining for a second time if the magnitude of current drawn or driven at the board output-terminal location is sufficient to establish the predetermined logic level; and
B. the indicating step comprises indicating that the board does not contain a digital circuit module of the proper type in the predetermined position and orientation if it was determined in the sensing step (i) that the current drawn or driven was insufficient all of the three steps (i), (ii), and (iii).

14. An apparatus as defined in claim 6 wherein:
A. the sensing means comprises:
  (i) first means for determining for a first time if the magnitude of current drawn or driven at the board output-terminal location is sufficient to establish a predetermined logic level;
  (ii) second means for determining if the magnitude of current drawn or driven at the board output-terminal location is sufficient to establish a logic level which is the complement of the predetermined logic level; and
  (iii) third means for determining for a second time if the magnitude of current drawn or driven at the board output-terminal location is sufficient to establish the predetermined logic level; and
B. the indicating means comprises means for indicating that the board does not contain a digital circuit module of the proper type in the predetermined position and orientation if it was determined by all of the first, second and third means that the current drawn or driven was insufficient.

* * * * *